United States Patent
Paik

(10) Patent No.: US 8,315,582 B2
(45) Date of Patent: Nov. 20, 2012

(54) APPARATUS AND METHOD FOR COMPENSATING FOR AUDIO SIGNAL DISTORTION IN MOBILE TERMINAL

(75) Inventor: Min-Chull Paik, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 594 days.

(21) Appl. No.: 11/870,094

(22) Filed: Oct. 10, 2007

(65) Prior Publication Data

US 2008/0132171 A1   Jun. 5, 2008

(30) Foreign Application Priority Data

Dec. 4, 2006  (KR) .................. 10-2006-0121337

(51) Int. Cl.
  *H04B 1/06*  (2006.01)
  *H04B 7/00*  (2006.01)
  *H04B 1/10*  (2006.01)
(52) U.S. Cl. .............. 455/232.1; 455/219; 455/222; 455/234.1; 455/296; 381/94.1; 381/107
(58) Field of Classification Search .......... 455/136, 455/138, 232.1–250.1, 295, 296, 305, 63.1, 455/219–222, 312; 330/129, 134, 278–279, 330/290–291; 381/94.1, 94.8, 94.9, 104, 330/107, 120

See application file for complete search history.

(56) References Cited

U.S. PATENT DOCUMENTS

| | | | | |
|---|---|---|---|---|
| 4,454,608 A * | 6/1984 | Maeba | ............ | 704/258 |
| 5,642,075 A * | 6/1997 | Bell | ............ | 330/129 |
| 5,907,622 A * | 5/1999 | Dougherty | ............ | 381/57 |
| 6,233,548 B1 * | 5/2001 | Schwartz et al. | ............ | 704/201 |
| 7,202,742 B2 * | 4/2007 | Nakagaki | ............ | 330/278 |
| 7,210,633 B2 * | 5/2007 | Broere | ............ | 235/472.01 |
| 7,221,226 B2 * | 5/2007 | Ogura | ............ | 330/281 |
| 7,742,746 B2 * | 6/2010 | Xiang et al. | ............ | 455/63.1 |
| 8,005,231 B2 * | 8/2011 | Shuttleworth et al. | ............ | 381/57 |
| 2006/0017501 A1 * | 1/2006 | Nodake | ............ | 330/141 |
| 2007/0274531 A1 * | 11/2007 | Camp | ............ | 381/74 |

FOREIGN PATENT DOCUMENTS

KR   1020070002524   1/2007

* cited by examiner

*Primary Examiner* — Simon Nguyen

(74) *Attorney, Agent, or Firm* — H.C. Park & Associates, PLC

(57) ABSTRACT

A method for compensating for audio signal distortion in a mobile terminal includes generating a digital audio signal at a gain, amplifying the digital audio signal into an amplified audio signal, reproducing the amplified audio signal, determining whether the amplified audio signal is distorted on the basis of at least one reference voltage, and adjusting the gain if the amplified audio signal is distorted.

17 Claims, 6 Drawing Sheets

| CODEC GAIN ||
|---|---|
| RECEIVE VOLUME LEVEL 5 | 500 ± 250 |
| RECEIVE VOLUME LEVEL 4 | 0 ± 250 |
| RECEIVE VOLUME LEVEL 3 | −500 ± 250 |
| RECEIVE VOLUME LEVEL 2 | −1000 ± 250 |
| RECEIVE VOLUME LEVEL 1 | −1500 ± 250 |

APPARATUS AND METHOD FOR COMPENSATING FOR AUDIO SIGNAL DISTORTION IN MOBILE TERMINAL

CROSS REFERENCE TO RELATED APPLICATION

This application claims priority from and the benefit of Korean Patent Application No. 10-2006-0121337, filed on Dec. 4, 2006, which is hereby incorporated by reference for all purposes as if fully set forth herein.

BACKGROUND OF THE INVENTION

1. Field of the Invention

The present invention relates to a mobile terminal and, more particularly, to an apparatus and a method for compensating for audio signal distortion in a mobile terminal that automatically control audio signal amplification through feedback of output of an audio amplifier to provide high-quality sounds.

2. Discussion of the Background

Currently, most mobile terminals and mobile appliances use digital audio amplification technology to amplify audio signals. In digital amplification, an analog input audio signal is converted into a digital audio signal, which is then amplified by an audio amplifier and is output as a sequence of pulses to a speaker.

In a mobile terminal or mobile appliance, the gain of an audio amplifier may be set by circuits other than the audio amplifier. Once the amplifier gain is set to a particular value, the audio amplifier may be used at the set gain value irrespective of power levels of input audio signals. If the signal level of an audio signal input to the audio amplifier is too high, the audio amplifier may produce distorted output, which causes the speaker to generate poor sounds. This problem may become severe for a mobile terminal that includes a speaker having a low sound pressure level rating. That is, when the amplifier gain is set to a value greater than a normal gain value for louder sounds, the input of an audio signal that is unexpectedly strong may distort the amplifier output, thereby degrading the audio quality.

SUMMARY OF THE INVENTION

The present invention provides an apparatus and method for compensating for audio signal distortion in a mobile terminal, wherein distortion in an audio output signal may be detected and compensated to provide high-quality sounds.

Additional features of the invention will be set forth in the description which follows, and in part will be apparent from the description, or may be learned by practice of the invention.

The present invention discloses a method for compensating for audio signal distortion in a mobile terminal, including generating a digital audio signal at a gain using a control unit, amplifying the digital audio signal into an amplified audio signal, reproducing the amplified audio signal, determining whether the amplified audio signal is distorted on the basis of at least one reference voltage, and adjusting the gain if the amplified audio signal is distorted.

The present invention also discloses an apparatus for compensating for audio signal distortion in a mobile terminal, including a control unit to generate a digital audio signal at a gain, a distortion compensating unit to amplify the digital audio signal and determine whether the amplified digital audio signal is distorted on the basis of at least one reference voltage, and a speaker to reproduce the amplified digital audio signal. If the amplified digital audio signal is distorted, the control unit adjusts the gain and then generates a new digital audio signal using the adjusted gain.

It is to be understood that both the foregoing description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
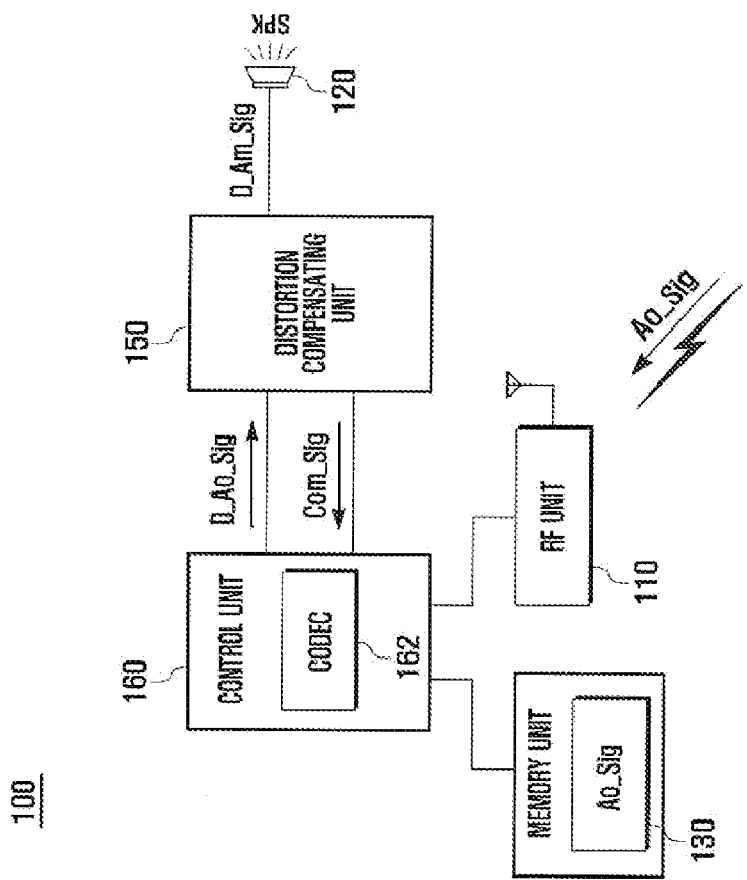
FIG. 1 shows a configuration of a mobile terminal according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

The mobile terminal of the present invention includes a speaker, and may be any information and communication appliance or multimedia appliance, such as a mobile communication terminal, a digital broadcast receiving terminal, a personal digital assistant, a smart phone, an international mobile telecommunications 2000 (IMT 2000) terminal, a wideband code division multiple access (WCDMA) terminal, or a universal mobile telecommunications system (UMTS) terminal.

FIG. 1 shows a configuration of a mobile terminal 100 according to an exemplary embodiment of the present invention.

Referring to FIG. 1, the mobile terminal 100 includes a control unit 160, a distortion compensating unit 150, a speaker 120, a radio frequency (RF) unit 110, and a memory unit 130.

The control unit 160 includes a coder/decoder (codec) 162 for converting an audio signal Ao_Sig received from an external source into a digital audio signal D_Ao_Sig for further processing.

The distortion compensating unit 150 amplifies a digital audio signal D_Ao_Sig from the codec 162 to produce an amplified audio signal D_Am_Sig, checks whether the amplified audio signal is distorted, and sends a comparison signal Com_Sig to the control unit 160 depending upon distortion of the amplified audio signal.

The speaker 120 reproduces an amplified audio signal D_Am_Sig from the distortion compensating unit 150.

The RF unit 110 receives an audio signal Ao_Sig from an external source. The memory unit 130 stores audio signals Ao_Sig that are received and supplies a stored audio signal to the control unit 160 if requested.

The codec 162 is a piece of software that converts audio and video data into digital data suitable for processing by the control unit 160, and also converts digital data into audio and video data suitable for output through the speaker 120 and a display unit (not shown). In addition, the codec 162 may compress a large amount of data, such as moving image data, through encoding and may decompress compressed audio or video data through decoding. The codec 162 is controlled to have various gain values, as shown in FIG. 2.

Figures 2, 3:
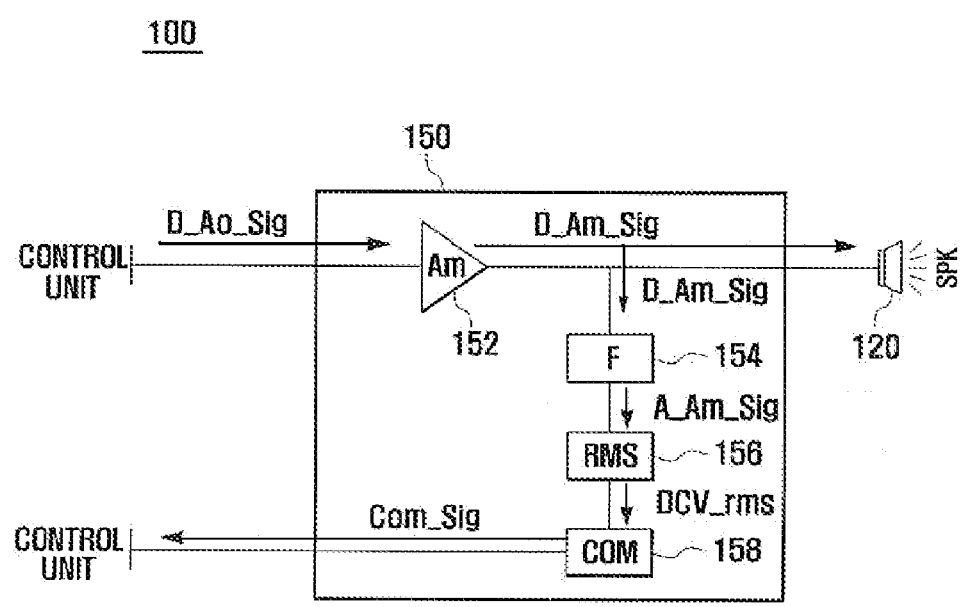
FIG. 2 is a gain setting table showing codec gain values according to receive volume levels.
FIG. 3 shows a configuration of a distortion compensating unit of the mobile terminal of FIG. 1.

FIG. 2 is a gain setting table showing codec gain values according to receive volume levels.

Referring to FIG. 2, five ranges of gain values are defined for the codec 162 at five receive volume levels. For example, a receive volume level '5' is associated with a gain value range of 500±250. Thus, at the receive volume level '5', the gain of the codec 162 may be varied within the corresponding gain value range of 500±250 on the basis of information regarding audio signal distortion. A receive volume level '4' is associated with a gain value range of 0±250, a receive volume level '3' is associated with a gain value range of −500±250, a receive volume level '2' is associated with a gain value range of −1000±250, and a receive volume level '1' is associated with a gain value range of −1500±250. Gain value ranges in FIG. 2 may vary according to performance parameters of the speaker and audio amplifier in use.

The codec 162 generates a digital audio signal D_Ao_Sig corresponding to samples of a received audio signal Ao_Sig at a preset gain at a selected receive volume level. The gain may be adjusted within the associated gain value range based on the distortion status data from the distortion compensating unit 150. The adjusted gain may be used by the codec 162 to generate a new digital audio signal D_Ao_Sig corresponding to the next audio signal samples Ao_Sig.

Receive volume levels may be set by the user. For an audio signal Ao_Sig, the gain of the codec 162 may be adjusted within a gain value range associated with a receive volume level set by the user, according to a comparison signal Com_Sig fed back from the distortion compensating unit 150.

The distortion compensating unit 150 amplifies a digital audio signal D_Ao_Sig from the codec 162 to produce an amplified audio signal D_Am_Sig. The distortion compensating unit 150 outputs the amplified audio signal to the speaker 120, and also checks whether the amplified audio signal is distorted and feeds a comparison signal Com_Sig back to the control unit 160.

Referring to FIG. 3, the distortion compensating unit 150 includes an audio amplifier 152, a filter 154, a root mean square (RMS) measurer 156, and a comparator section 158.

The audio amplifier 152 amplifies a digital audio signal D_Ao_Sig to produce an amplified audio signal D_Am_Sig.

The filter 154 is configured to convert a portion of the amplified audio signal D_Am_Sig into an amplified analog signal A_Am_Sig. The filter 154 would be unnecessary if the audio amplifier 152 produces analog output.

The RMS measurer 156 measures an RMS voltage DCV_rms of the amplified analog signal A_Am_Sig.

The comparator section 158 compares the measured RMS voltage DCV_rms with a preset reference voltage, and sends a comparison signal Com_Sig as a comparison result to the control unit 160.

The reference voltage at the comparator section 158 may be changed by the control unit 160 according to receive volume levels. For example, a reference voltage of 1.75 V may be applied to the comparator section 158 for the receive volume level '1', a reference voltage of 1.80 V for the receive volume level '2', a reference voltage of 1.85 V for the receive volume level '3', a reference voltage of 1.90 V for the receive volume level '4', and a reference voltage of 1.95 V for the receive volume level '5'.

The speaker 120 reproduces an amplified audio signal D_Am_Sig from the audio amplifier 152.

The control unit 160 adjusts the gain of the codec 162 at the current receive volume level according to a comparison signal Com_Sig, resulting from previous samples of an input audio signal Ao_Sig fed back by the distortion compensating unit 150. The control unit 160 generates a digital audio signal D_Ao_Sig corresponding to current samples of the audio signal Ao_Sig at the adjusted gain, and provides the digital audio signal D_Ao_Sig to the distortion compensating unit 150. The distortion compensating unit 150 amplifies the digital audio signal D_Ao_Sig to produce an amplified audio signal D_Am_Sig, checks whether the amplified audio signal is distorted, and sends a comparison signal Com_Sig to the control unit 160. This process of signal generation, signal amplification, distortion checking, and codec gain adjustment is repeated until all samples of the audio signal Ao_Sig are output.

The above process is described in more detail as follows. The control unit 160 generates a digital audio signal D_Ao_Sig corresponding to samples of an input audio signal Ao_Sig, through the codec 162 at a preset gain at a selected receive volume level, and sends the generated digital audio signal D_Ao_Sig to the distortion compensating unit 150. The distortion compensating unit 150 amplifies the digital audio signal into an amplified audio signal D_Am_Sig, converts a portion of the amplified audio signal through filtering into an amplified analog signal A_Am_Sig, and measures an RMS voltage DCV_rms of the amplified analog signal. The distortion compensating unit 150 compares the measured RMS voltage with a preset reference voltage, generates a comparison signal Com_Sig indicating which of the RMS voltage and reference voltage is higher, and sends the generated comparison signal back to the control unit 160. The control unit 160 may perform codec gain adjustment by increasing or decreasing the gain of the codec 162 by a preset value on the basis of the comparison signal Com_Sig. The control unit 160 generates a new digital audio signal D_Ao_Sig corresponding to the next samples of the audio signal Ao_Sig at the adjusted gain, and sends the digital audio signal D_Ao_Sig to the distortion compensating unit 150. In return, the distortion compensating unit 150 sends another comparison signal Com_Sig back to the control unit 160.

For gain adjustment in repetition of the above process, the control unit 160 may decrease the gain of the codec 162 by a preset value when an RMS voltage is higher than the reference voltage ('High' in a feedback comparison signal). In addition, if the comparison result, plus other available information, indicates that an amplified signal is too weak due to prior gain reduction, the control unit 160 may increase the gain of the codec 162. For smooth audio output, the codec gain may be reset to, for example, the average of the initial unadjusted gain value and the current gain value. After processing the input audio signal Ao_Sig, the control unit 160 may reset the gain of the codec 162 to the initial gain value prior to gain adjustment so that the codec gain may be readjusted for a new audio signal from an external source.

The RF unit 110 receives an audio signal Ao_Sig from an external source through a communication channel, and forwards the received audio signal Ao_Sig to the control unit 160.

The memory unit 130 stores received audio signals Ao_Sig, and supplies a stored audio signal to the control unit 160 if requested.

The mobile terminal 100 may further include a display unit for displaying visual information, a music playing module such as an MPEG-1 Audio Layer 3 (MP3) module, a digital broadcast receiving module, and/or a camera module.

Figure 4:
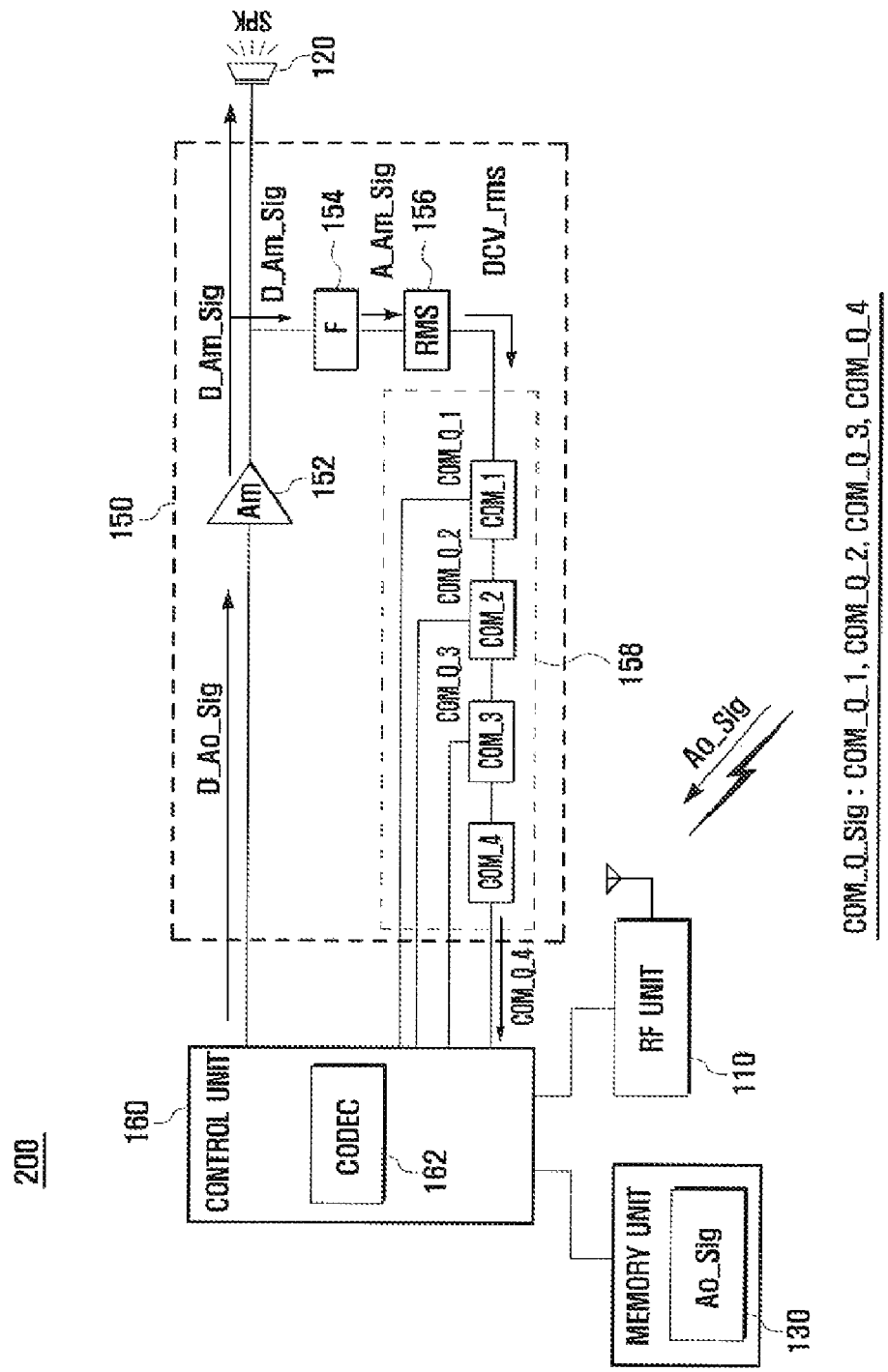
FIG. 4 shows a configuration of a mobile terminal according to another exemplary embodiment of the present invention.

FIG. 4 shows a configuration of a mobile terminal 200 according to another exemplary embodiment of the present invention. Some elements of the mobile terminal 200 are the same as corresponding elements of the mobile terminal 100. Therefore, a repeated description thereof is omitted.

Referring to FIG. 4, the mobile terminal 200 includes a control unit 160, a distortion compensating unit 150, a speaker 120, a radio frequency (RF) unit 110, and a memory unit 130.

The control unit 160 includes a codec 162 to convert an input audio signal Ao_Sig received from an external source into a digital audio signal D_Ao_Sig for further processing.

The distortion compensating unit 150 amplifies a digital audio signal D_Ao_Sig from the codec 162 to produce an amplified audio signal D_Am_Sig, outputs the amplified audio signal to the speaker 120, checks whether the amplified audio signal is distorted, and sends a comparison signal indicating the degree of distortion in the amplified audio signal to the control unit 160. The distortion compensating unit 150 may be included in the control unit 160.

The speaker 120 reproduces an amplified audio signal D_Am_Sig from the distortion compensating unit 150.

The RF unit 110 receives an audio signal Ao_Sig from an external source. The memory unit 130 stores audio signals Ao_Sig that are received and supplies a stored audio signal to the control unit 160 if requested.

The distortion compensating unit 150 of the mobile terminal 200 includes an audio amplifier 152, a filter 154, an RMS measurer 156, and a comparator section 158 including a plurality of comparators COM_1, COM_2, COM_3, and COM_4 connected in series.

The audio amplifier 152, filter 154, and RMS measurer 156 are identical to corresponding elements of the mobile terminal 100, and a repeated description thereof is omitted.

The comparator section 158 includes the serially connected comparators COM_1, COM_2, COM_3, and COM_4. Different reference voltages are applied to the comparators COM_1, COM_2, COM_3, and COM_4 to identify the degree of distortion in an amplified signal by sequentially comparing an RMS voltage of the amplified signal with the reference voltages thereof. The degree of distortion in the amplified signal is used by the control unit 160 for codec gain adjustment.

For example, assume that a first reference voltage of 0.5 V is applied to the comparator COM_1, a second reference voltage of 0.6 V is applied to the comparator COM_2, a third reference voltage of 0.7 V is applied to the comparator COM_3, a fourth reference voltage of 0.8 V is applied to the comparator COM_4, and an RMS voltage of 0.69 V is output by the RMS measurer 156. When the RMS voltage of 0.69 V is input to the comparator COM_1, the RMS voltage of 0.69 V is higher than the first reference voltage of 0.5 V. Hence, the comparator COM_1 outputs a 'High' value as a comparison signal COM_Q_1 to the control unit 160, and the RMS voltage of 0.69 V is passed to the comparator COM_2. When the RMS voltage of 0.69 V is input to the comparator COM_2, the RMS voltage of 0.69 V is higher than the second reference voltage of 0.6 V. Hence, the comparator COM_2 outputs a 'High' value as a comparison signal COM_Q_2 to the control unit 160, and the RMS voltage of 0.69 V is passed to the comparator COM_3. When the RMS voltage of 0.69 V is input to the comparator COM_3, the RMS voltage of 0.69 V is lower than the third reference voltage of 0.7 V. Hence, the comparator COM_3 outputs a 'Low' value as a comparison signal COM_Q_3 to the control unit 160, and the RMS voltage of 0.69 V is not passed to the comparator COM_4. Accordingly, the control unit 160 may identify the degree of distortion in an amplified signal using a feedback comparison signal from the distortion compensating unit 150.

Figure 5:
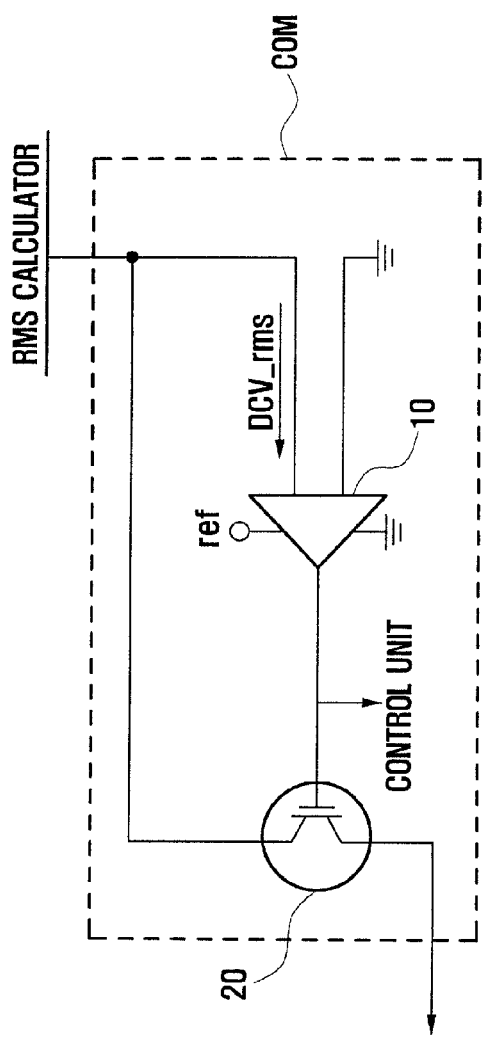
FIG. 5 shows a configuration of a comparator stage in the mobile terminal of FIG. 4.

In particular, the comparator section 158 of the mobile terminal 200 may be implemented using a combination of a transistor 20 (for example, a field-effect transistor) and a comparator 10, as shown in FIG. 5. The transistor 20 and the comparator 10 correspond to a comparison stage of the comparator section 158. Referring to FIG. 5, when an RMS voltage from the RMS measurer 156 is input to the comparator 10, the comparator 10 outputs a 'High' value if the RMS voltage is higher than a preset reference voltage ref, and outputs a 'Low' value if the RMS voltage is lower than the reference voltage ref. The output of the comparator 10 is connected to the gate terminal of the transistor 20. When the output of the comparator 10 is 'High', the RMS voltage may be passed through the transistor 20 to another comparator of the next comparison stage. Hence, in a multistage comparator like the comparator section 158 in FIG. 4, the control unit 160 can identify the degree of distortion in an amplified signal by detecting a comparison stage whose comparator output is 'Low'. The comparator section 158 of the mobile terminal 200 may be implemented using multistage circuits other than the combination of a transistor and comparator, wherein an input value may be passed to the next stage according to a comparison result of the current stage.

The reference voltages may change according to the receive volume level of the codec 162. The reference voltages are set to higher values with the receive volume level, under the control of the control unit 160. For example, at the receive volume level '1', the first, second, third, and fourth reference voltages may be set to 0.5 V, 0.6 V, 0.7 V, and 0.8 V, respectively. At the receive volume level '2', the first, second, third, and fourth reference voltages may be set to 1.0 V, 1.1 V, 1.2 V, and 1.3 V, respectively.

At a given receive volume level, the gain of the codec 162 may be adjusted according to the degree of distortion in the amplified signal. For example, the control unit 160 decreases the codec gain by 50 in response to a comparison signal COM_Q_1 from the comparator COM_1, by 100 in response to a comparison signal COM_Q_2 from the comparator COM_2, by 150 in response to a comparison signal COM_Q_3 from the comparator COM_3, and by 200 in response to a comparison signal COM_Q_4 from the comparator COM_4.

In addition, if the comparison result, plus other available information, indicates that an amplified signal is too weak due to prior gain reduction, the control unit 160 may increase the gain of the codec 162. For smooth audio output, the codec gain may be reset to, for example, the average of the initial unadjusted gain value and the current gain value. At the end of processing of the current input audio signal Ao_Sig, the control unit 160 may reset the gain of the codec 162 to the initial gain value prior to gain adjustment so that the codec gain may be readjusted for a new audio signal from an external source.

The comparator section 158 of the mobile terminal 200 may be implemented using more than four serial comparison stages for finer gain adjustment.

Figure 6:
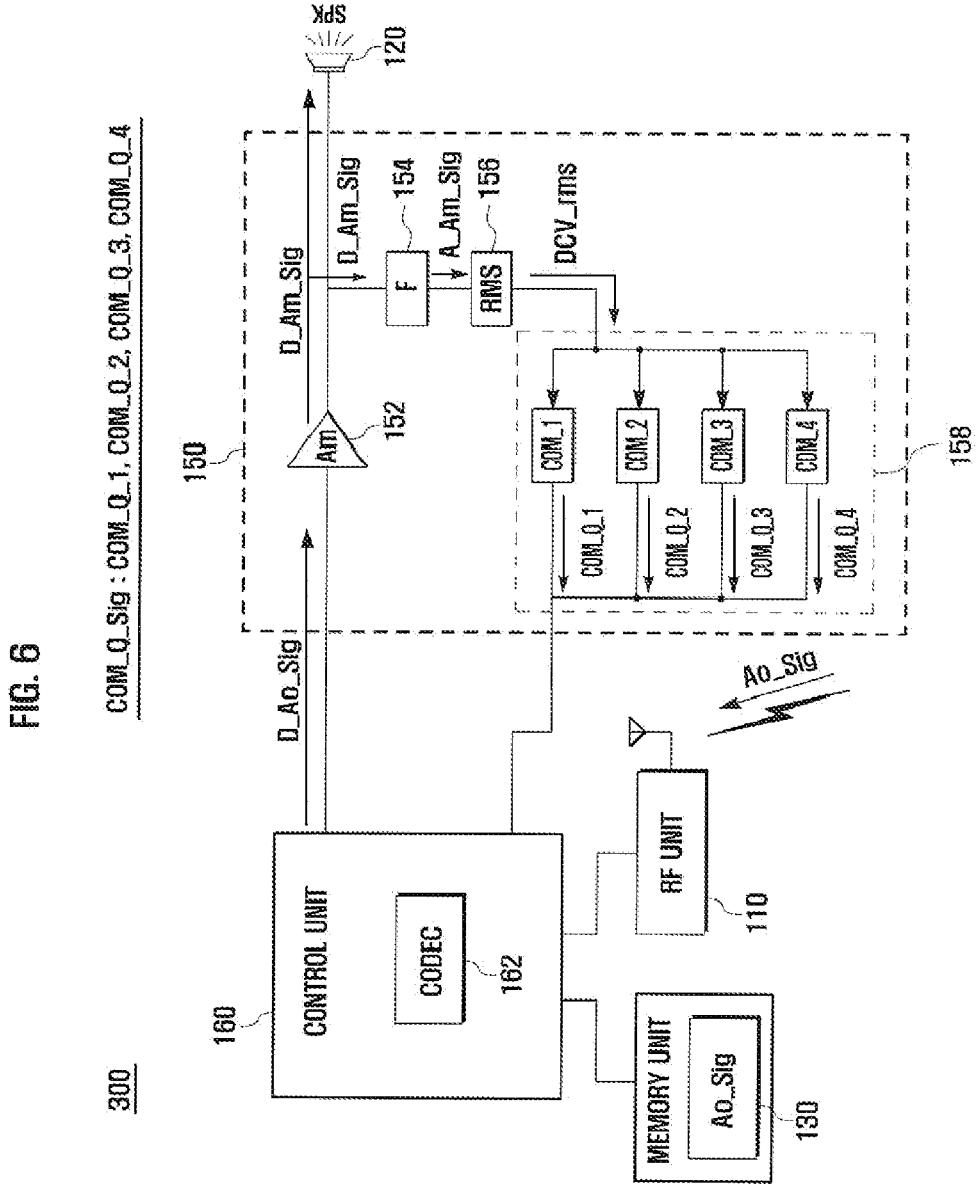
FIG. 6 shows a configuration of a mobile terminal according to another exemplary embodiment of the present invention.

FIG. 6 shows a configuration of a mobile terminal 300 according to another exemplary embodiment of the present invention. Some elements of the mobile terminal 300 are the same as corresponding elements of the mobile terminal 100. Therefore, the same elements are denoted by the same reference numerals, and a repeated description thereof is omitted.

Referring to FIG. 6, the mobile terminal 300 includes a control unit 160, a distortion compensating unit 150, a speaker 120, a radio frequency (RF) unit 110, and a memory unit 130.

The control unit 160 includes a codec 162 to convert an input audio signal Ao_Sig received from an external source into a digital audio signal D_Ao_Sig for further processing.

The distortion compensating unit 150 amplifies a digital audio signal D_Ao_Sig from the codec 162 to produce an amplified audio signal D_Am_Sig, outputs the amplified audio signal to the speaker 120, checks whether the amplified audio signal is distorted, and sends a comparison signal indicating the degree of distortion in the amplified audio signal to the control unit 160.

The speaker 120 reproduces an amplified audio signal D_Am_Sig from the distortion compensating unit 150.

The RF unit 110 receives an audio signal Ao_Sig from an external source. The memory unit 130 stores the audio signals Ao_Sig, and supplies a stored audio signal to the control unit 160 if requested.

The distortion compensating unit 150 of the mobile terminal 300 includes an audio amplifier 152, a filter 154, an RMS measurer 156, and a comparator section 158 including a plurality of comparators COM_1, COM_2, COM_3, and COM_4 connected in parallel.

The audio amplifier 152, filter 154, and RMS measurer 156 are identical to corresponding elements of the mobile terminal 100, and a repeated description thereof is omitted.

The comparator section 158 includes the comparators COM_1, COM_2, COM_3, and COM_4 connected in parallel. Different reference voltages are applied to the comparators COM_1, COM_2, COM_3, and COM_4 to identify the degree of distortion in an amplified signal by simultaneously comparing an RMS voltage of the amplified signal with the reference voltages thereof. One of the four comparison results COM_Q_1, COM_Q_2, COM_Q_3, or COM_Q_4 is sent to the control unit 160. The control unit 160 adjusts the gain of the codec based on the degree of distortion in the amplified signal.

The reference voltages of the comparators may be changed according to the receive volume level of the codec 162, as described in connection with FIG. 4.

At a given receive volume level, the gain of the codec 162 may be adjusted according to the degree of distortion in the amplified signal, as described in connection with FIG. 4.

As described above, the distortion compensating unit 150 of the mobile terminal 300, in comparison to that of the mobile terminal 200, may provide faster distortion feedback to the control unit 160 by simultaneously comparing an RMS voltage with multiple reference voltages.

Figure 7:
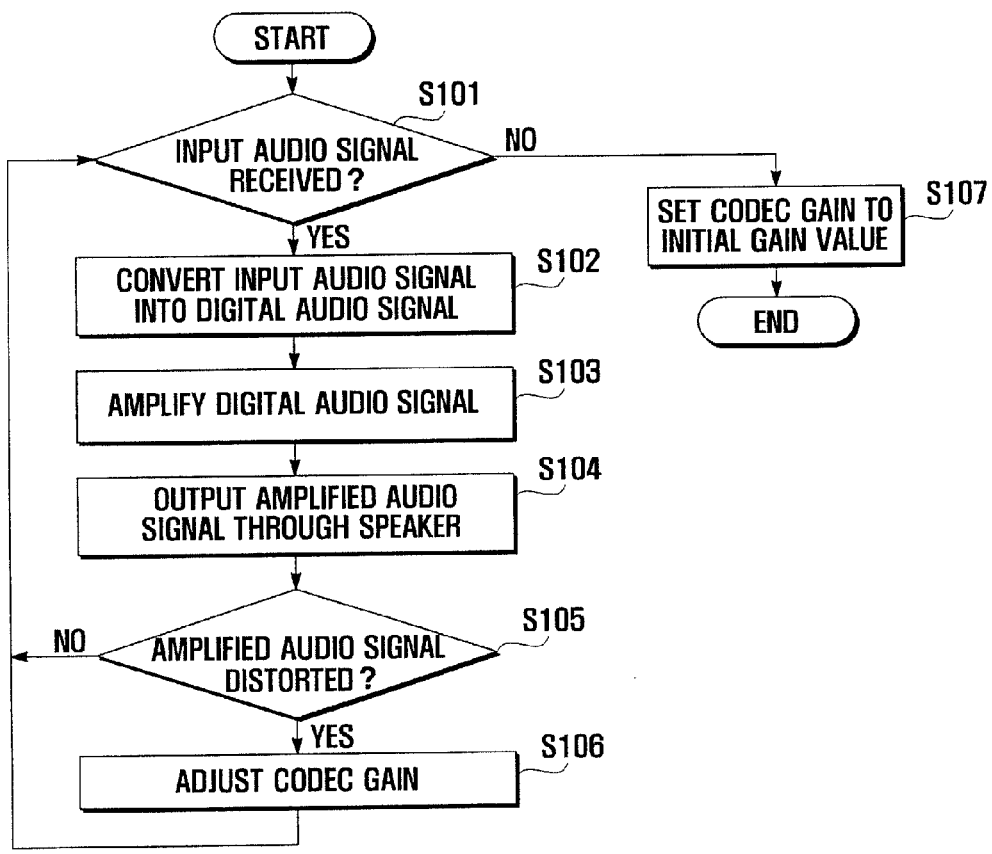
FIG. 7 is a flow chart showing a method for audio signal distortion compensation according to another exemplary embodiment of the present invention.

FIG. 7 is a flow chart showing a method for audio signal distortion compensation in a mobile terminal according to another exemplary embodiment of the present invention.

Referring to FIG. 7, the control unit 160 sets the receive volume level of the codec 162 according to a user selection, and determines whether an input audio signal Ao_Sig has been received (S101).

At step S101, the audio signal Ao_Sig may be an incoming audio signal through the RF unit 110 or an audio signal stored in the memory unit 130. The set receive volume level determines one or more reference voltages to the comparator section 158. For example, the receive volume level may have five volume levels, and the reference voltage at a receive volume level '1' may be different from that at a receive volume level '2'. The control unit 160 controls setting of different reference voltages to the comparator section 158 according to a change in the receive volume level.

If an input audio signal is not received, the control unit 160 may control the mobile terminal to perform a preset operation (S107).

If an input audio signal is received, the control unit 160 may convert the input audio signal Ao_Sig into a digital audio signal D_Ao_Sig through the codec 162 at a preset gain associated with the receive volume level, and may supply the digital audio signal to the distortion compensating unit 150 (S102). A range of gain values is defined for a receive volume level, as described in connection with FIG. 2. For distortion compensation, the gain of the codec 162 may be adjusted within a gain range associated with a particular receive volume level.

The distortion compensating unit 150 amplifies the digital audio signal through the audio amplifier 152 using a preset gain into an amplified audio signal D_Am_Sig (S103).

The amplified audio signal is output to the speaker 120 for reproduction (S104), and is compared with the reference voltage for distortion checking (S105).

At step S105, a portion of the amplified audio signal is converted through filtering into an amplified analog signal A_Am_Sig and the RMS voltage DCV_rms of the amplified analog signal is measured. If the audio amplifier 152 produces analog output, digital-to-analog conversion is unnecessary.

Further at step S105, checking for signal distortion may be performed differently according to the configuration of the comparator section 158. When the comparator section 158 includes a single comparator, the RMS voltage may be compared to a reference voltage and the comparison result ('High' or 'Low') may be transmitted to the control unit 160. The gain of the codec 162 may be adjusted in a stepwise manner with iterations of the distortion compensation loop.

When the comparator section 158 includes a plurality of serially connected comparators, the RMS voltage may be sequentially compared to different reference voltages of the serially connected comparators and the comparison result indicating the degree of distortion may be transmitted to the control unit 160. When the comparator section 158 includes a plurality of comparators connected in parallel, the RMS voltage may be simultaneously compared with different reference voltages of the parallel comparators and the comparison result indicating the degree of distortion may be transmitted to the control unit 160. The gain of the codec 162 may be more finely adjusted in a stepwise manner through iterations of the distortion compensation loop.

Thereafter, if the comparison result from the distortion compensating unit 150 indicates the occurrence of signal distortion, the control unit 160 may adjust the gain of the codec 162 according to the degree of distortion (S106), and may return to step S101 for further processing. The adjusted gain of the codec 162 may be used for processing of subsequent input audio signals.

At step S106, when the comparison result from the distortion compensating unit 150 having a single comparator is 'High', the control unit 160 may decrease the gain of the codec 162 by a preset value. When the comparison result from the distortion compensating unit 150 having multiple comparators indicates the degree of distortion, the control unit 160 may decrease the gain of the codec 162 by a preset value corresponding to the degree of distortion.

If the comparison result from the distortion compensating unit 150 indicates non-occurrence of distortion, the control unit 160 may return to step S101 to process the next input audio signal.

Further at step S106, if the comparison results indicate that an amplified signal is too weak due to prior gain reduction, the control unit 160 may increase the gain of the codec 162. That is, for signal distortion compensation, the gain of the codec 162 may be decreased when an audio signal that is too strong is input, and may be increased when an audio signal that is too weak is input after gain reduction.

As apparent from the above description, exemplary embodiments of the present invention provide an apparatus and method for compensating audio signal distortion in a mobile terminal that may adaptively compensate for signal distortion to provide high-quality sounds.

It will be apparent to those skilled in the art that various modification and variations can be made in the present invention without departing from the spirit or scope of the invention. Thus, it is intended that the present invention cover the modifications and variations of this invention provided they come within the scope of the appended claims and their equivalents.

What is claimed is:

1. A method to compensate for audio signal distortion in a mobile terminal, comprising:
    amplifying a digital audio signal at a gain corresponding to a receive volume level;
    determining a root mean square (RMS) voltage of the amplified audio signal;
    comparing the determined RMS voltage with at least one reference voltage,
        wherein the at least one reference voltage is changed according to the receive volume level;
    generating a comparison signal indicating whether the amplified audio signal is distorted, based on a result of the comparison;
    receiving the comparison signal; and
    adjusting the gain within a gain value range associated with the receive volume level, if the comparison signal indicates that the amplified audio signal is distorted.

2. The method of claim 1, wherein the adjusting the gain further comprises:
    generating a new digital audio signal using the adjusted gain.

3. The method of claim 2, wherein the adjusting of the gain further comprises resetting the gain to an average of an initial gain value and a current gain value, if the amplified audio signal is weak due to prior gain adjustment.

4. The method of claim 1, wherein the determining comprises:
    comparing the determined RMS voltage with reference voltages;
    identifying one of the reference voltages that is closest to the determined RMS voltage; and
    generating a comparison signal indicating the identified reference voltage.

5. The method of claim 4, wherein the comparing of the determined RMS voltage with the reference voltages comprises sequentially comparing the determined RMS voltage with each of the reference voltages.

6. The method of claim 4, wherein the comparing of the determined RMS voltage with the reference voltages comprises simultaneously comparing the determined RMS voltage with the reference voltages.

7. The method of claim 4, wherein the adjusting of the gain comprises:
    adjusting the gain to a value corresponding to the comparison signal; and
    generating a new digital audio signal using the adjusted gain.

8. The method of claim 1, wherein the determining further comprises:
    converting a portion of the amplified audio signal into an amplified analog signal through filtering.

9. An apparatus to compensate for audio signal distortion in a mobile terminal, comprising:
    a distortion compensating unit to amplify a digital audio signal at a gain corresponding to a receive volume level, to determine a root mean square (RMS) voltage of the amplified digital audio signal, to compare the determined RMS voltage with at least one reference voltage, and to generate a comparison signal indicating whether the amplified audio signal is determined to be distorted, based on a result of the comparison; and
    a control unit to receive the comparison signal, to adjust the gain within a gain value range associated with the receive volume level, if the comparison signal indicates that the amplified digital audio signal is distorted, and to generate a new digital audio signal using the adjusted gain,
    wherein the at least one reference voltage is changed according to a receive volume level.

10. The apparatus of claim 9, wherein the control unit comprises a coder/decoder (codec) that has user selectable receive volume levels that are each associated with a range of gain values.

11. The apparatus of claim 9, wherein the distortion compensating unit comprises:
    an audio amplifier to amplify, the digital audio signal according to the gain, to generate the amplified digital audio signal;
    a root mean square (RMS) measurer to measure the RMS voltage of the amplified digital audio signal; and
    a comparator section to compare the measured RMS voltage with the at least one reference voltage and to generate the comparison signal.

12. The apparatus of claim 11, wherein the distortion compensating unit further comprises a filter to convert a portion of the amplified digital audio signal into an amplified analog audio signal through filtering, if the audio amplifier produces a digital output.

13. The apparatus of claim 11, wherein the comparator section comprises a comparator to compare the measured RMS voltage with the at least one reference voltage to generate the comparison signal.

14. The apparatus of claim 11, wherein the comparator section comprises serially connected comparators to sequentially compare the measured RMS voltage with the at least one reference voltage to determine one of the at least one reference voltage that is closest to and does not exceed the measured RMS voltage, and to transmit the comparison signal to the control unit.

15. The apparatus of claim 14, wherein each comparator comprises:
- a comparator device to compare a voltage of an input signal with the at least one reference voltage; and
- a switching device to pass the input signal to a next stage according to a comparison result from the comparator device.

16. The apparatus of claim 11, wherein the comparator section comprises parallel comparators to simultaneously compare the measured RMS voltage with the at least one reference voltage to determine one of the at least one reference voltage that is closest to and does not exceed the measured RMS voltage, and to transmit the comparison signal to the control unit.

17. The apparatus of claim 16, wherein each comparator comprises:
- a comparator device to compare a voltage of an input signal with the at least one reference voltage; and
- a switching device to pass the comparison signal to the control unit according to a comparison result from the comparator device.

* * * * *